United States Patent [19]

Kinoshita et al.

[11] 4,255,726
[45] Mar. 10, 1981

[54] SURFACE ACOUSTIC WAVE FILTER
[75] Inventors: Yasuaki Kinoshita; Toyoji Tabuchi, both of Hachioji, Japan
[73] Assignee: Hitachi, Ltd., Japan
[21] Appl. No.: 18,331
[22] Filed: Mar. 7, 1979
[30] Foreign Application Priority Data Mar. 20, 1978 [JP] Japan ............................ 53-34584[U]

[51] Int. Cl.³ .................... H03H 9/64; H01L 41/18
[52] U.S. Cl. .............................. 333/195; 333/109; 333/196
[58] Field of Search .......................... 333/150–155, 333/193–196, 109; 310/313

[56] References Cited
U.S. PATENT DOCUMENTS 3,886,504  5/1975  Hartmann et al. ................... 310/313

OTHER PUBLICATIONS

Marshall et al., "Theory and Design of the Surface Acoustic Wave Multistrip Coupler," in IEEE Trans. on Sonics and Ultrasonics, vol. SU-20, No. 2, Apr. 1973, pp. 124–133.

Primary Examiner—Marvin L. Nussbaum
Attorney, Agent, or Firm—Craig and Antonelli

[57] ABSTRACT

A surface acoustic wave filter having transmitting and receiving transducers, coupling transducers, as well as reflecting transducers which are arrayed on a piezoelectric substrate. The coupling transducers are so designed as to function as 3-dB directional couplers in order to obtain frequency characteristics over a wide range without developing ripples.

5 Claims, 3 Drawing Figures

SURFACE ACOUSTIC WAVE FILTER

BACKGROUND OF THE INVENTION

1. Field of the Invention:

The present invention is concerned with a structure of a filter utilizing the propagation phenomenon of surface acoustic waves, for use in general wireless and cabled communications equipment, and broadcasting transmitters and receivers.

2. Description of the Prior Art:

Surface acoustic wave devices utilizing the propagation phenomenon of surface acoustic waves have been developed, and some of them have been placed in practical use to replace the conventional resonators and filters which consist of inductance elements and capacitance elements. For instance, a typical example of the surface acoustic wave filters designed to broaden the band and to reduce the insertion losses is a two-port resonant filter of a so-called ring structure in which a transmitting transducer and a receiving transducer are arrayed in cascade on a surface of a piezo-electric substrate, and two sets of slanted grating pairs are arrayed on both sides thereof. With this structure, however, it is difficult to obtain a specific band width greater than 2%. Another known example of the surface acoustic wave filter is of a construction in which a transmitting transducer and a receiving transducer are arrayed in cascade on the surface of a piezo-electric substrate, and multi-strip couplers and reflecting transducers are arrayed in parallel on both sides.

The present invention is directed to the latter of the abovementioned two examples. With the surface wave filter latter structure of the, however, although the multi-strip coupler functions as a directional coupler, the number of the strip conductors constituting the multi-strip coupler must be very increased to heighten the coupling degree. Therefore, it is difficult to make the filters in small sizes thus offsetting the advantages gained by the use of smaller sizes. Further, with the conventional devices, a sufficient reduction of the insertion losses or broadening of the band has not yet been realized also, the frequency characteristics are not flat, and ripple components develop.

LIST OF THE PRIOR ART (37 CRF 1.56(a))

The following reference is cited to show the state of the art.

U.S. Pat. No. 3,886,504

SUMMARY OF THE INVENTION

The object of the present invention therefore is to provide a surface acoustic wave filter featuring small insertion losses and broad band, and without developing ripples in the frequency characteristics.

In order to accomplish the abovementioned object, the present invention provides a two-port surface acoustic wave filter comprising a piezo-electric substrate on which are arrayed a transmitting transducer (input transducer) and a receiving transducer (output transducer), with coupling transducers and reflecting transducers placed on both sides thereof the coupling transducers serve as a 3-dB coupler to equally divide into two the electric power of surface waves, and the piezo-electric substrate exhibits an increased electromechanical coupling coefficient $k^2$.

Other objects and features of the present invention will become further obvious as the description proceeds in conjunction with the accompanying drawings.

DESCRIPTION OF THE PREFERRED EMBODIMENTS

Figure 1:
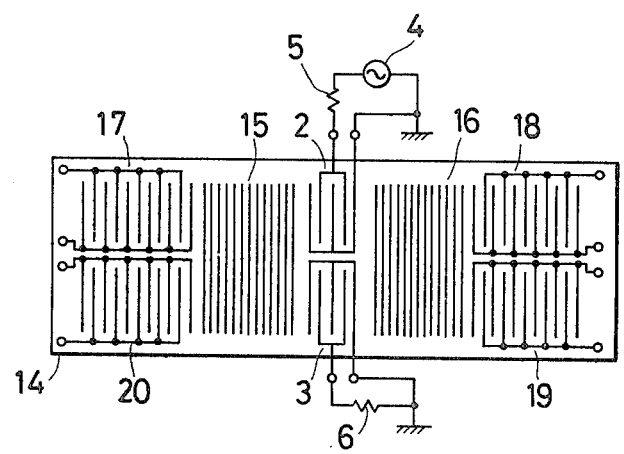
FIG. 1 and FIG. 3 are plan views showing surface acoustic wave filters according to the embodiments of the present invention.

FIG. 1 is a plan view showing the structure of a surface acoustic wave filter according to an embodiment of the present invention. As diagramatized, the filter consists of a piezo-electric substrate 14 on which are arrayed an interdigital transmitting transducer 2 for converting electric signals 4 into surface acoustic waves, an interdigital receiving transducer 3 for converting the surface acoustic waves into electric signals, coupling transducers 15 and 16 arrayed in parallel on both sides of the transducers 2 and 3, and interdigital reflecting transducers 17, 18, 19 and 20 placed on the outer sides of the transducers 15 and 16. Reference numerals 5 and 6 denote resistors of external circuits.

During the operation of the filter, the electric signals are converted into surface waves by the transmitting transducer, i.e., by the input transducer, divided into two and are propagated toward the right and left directions. Parts of the waves are coupled to the reflecting transducers (hereinafter referred to as reflectors) via the coupling transducers, i.e., via the multi-strip couplers 15 and 16, and another part of the waves is coupled to the receiving transducer, i.e., to the output transducer 3 via the multi-strip couplers. The surface waves reflected by the reflectors are returned again to the input and output transducers via the coupling transducers. By repeating the above operations, the energy of the waves is propagated to the output transducer. By appropriately selecting the material of the substrate 2 and the geometrical configurations and distances of thin stip conductors constituting the transducers, it is possible to impart desired filtering characteristics from an electrical point of view. This fact has been well known, and the details are not mentioned here.

With the conventional surface acoustic wave filter similar to the type shown in FIG. 1, however, it was difficult to construct a filter having broad band for passing the frequencies. That is, to construct a filter having broad band, it is necessary to broaden the band of reflecting characteristics of the reflection system. If the reflection system is allowed to have broad-band characteristics, however, the frequency characteristics of the filter fluctuate which given rise to the occurrence of ripples and making it difficult to materialize a practical filter having broad band.

According to the present invention, in order to attain broad-band characteristics without developing ripples, the multi-strip couplers are so designed as to work as a 3-dB directional coupler so that the electric power of the surface waves can be equally divided into two. In other words, the electrode pitch of the multi-strip couplers is shorter (e.g., 0.7 times) than that of the electrodes of the transducers, and the number of electrodes M of the multi-strip couplers is set to the number of electrodes Mc so as to function as a 3-dB directional coupler, so that when the surface acoustic waves reflected by the reflectors pass again through the multi-strip couplers, most of the electric power of the acoustic waves is incident upon the output transducer 3 and the surface acoustic waves are scarcely returned to the input transducer.

The number of electrodes Mc that work as the 3-dB coupler is determined according to the following formula, $$Mc \simeq \frac{\pi}{2FK^2} \cdot \frac{\frac{\theta}{2}}{\sin \theta/2}$$

where $k^2$ represents an electromechanical coupling coefficient given by a sonic speed $v_s$ of the surface waves travelling on free surfaces and a sonic speed of the waves propagating on the surfaces which are electrically short-circuited, F a coefficient determined by the shape of the electrodes, and $Fk^2 \simeq k_s^2$. Further, $\sigma$ is given by $2\pi f \alpha d_0/v_s$, $d_0$ denotes a distance between each of the strip conductors of the multi-strip couplers, and $\alpha$ represents an active fraction of periodically repeating distance of the multi-strip couplers.

Figure 2:
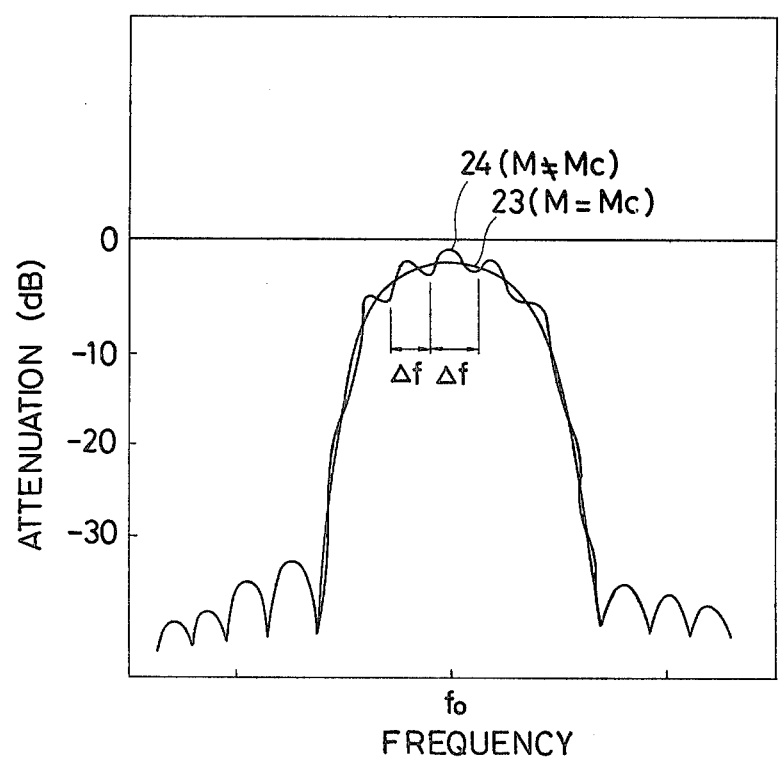
FIG. 2 is a diagram of frequency characteristics of a filter for illustrating the effects of the present invention.

FIG. 2 is a diagram showing frequency characteristics of the filter when the coupling transducers are so set up as to work as a 3-dB directional coupler. The curve 23 23, i.e., when the number of electrodes Mc are so selected as to satisfy the aforementioned formula, and when the number of electrodes Mc are so selected as will not to In FIG. 2, the rippling period $\Delta f$ is given by $$\Delta f = v_s/dl$$

where $v_s$ represents a sonic speed of the surface acoustic waves, and dl denotes an equivalent propagation length from the input transducer 2 to the output transducer 3, which can be found by measurement. The rippling magnitude in this band depends upon the multimode resonance in the two reflectors and further upon the matching state between the input and output transducers and the external circuits.

Further, with the surface acoustic wave filter of the present invention, the electromechanical coupling coefficient $k^2$ can be increased to be greater than that of the conventional counterparts by so selecting the material of the piezo-electric substrate, propagation mode of the acoustic waves, cross-sectional shape of the substrate and the propagation axis as will be mentioned below, in order to reduce the number of electrodes Mc of the multi-strip couplers to a practical values. Other utilizable effects can also be obtained by selecting the substrate material having a great coefficient $k^2$ and suitably selecting the propagation mode. This means that the reflecting frequency characteristics of the reflecting transducers 17, 18, 19 and 20 are broadened, enabling the number of electrodes to be reduced.

According to the present invention, the material of the piezo-electric substrate and the surface acoustic wave mode propagating on the surface of the substrate are so selected as to have a mode of a great electromechanical coupling coefficient $k^2$. Table 2 shows the examples.

TABLE 2

| Substrates having great $k^2$ and propagation modes | | |
|---|---|---|
| Substrate material | $k^2$ | Mode |
| LiNbO$_3$ 64° Y-X | 0.11 | Surface shear wave |
| LiNbO$_3$ 41° Y-X | 0.17 | " |
| PZT ceramics, Y-cut X-axis propagation | 0.05–0.3 | " |
| Pb$_2$KNb$_5$O$_{15}$ | 0.2–0.3 | " |
| Pb$_2$KNb$_5$O$_{15}$ | 0.14 | Rayleigh wave |

Furthermore it has been known that the coupling coefficient $k^2$ in the surface shear wave mode of the rotated 61°–41° Y-cut X-axis propagation of a single crystal of LiNbO$_3$ (lithium niobate) is greater than 10%. It has also been known that the coupling coefficient $k^2$ of as great as 10 to 20% is also exhibited by the Bleustein-Gulyaev waves (pure surface shear waves) which propagate in the direction of X-axis on the surface of a PZT (lead zirconate-titanate) ceramic cut in parallel with the polarization axis (Z-axis). It has been theoretically pointed out that the surface shear wave mode and the Reyleigh wave mode of a single crystalline substrate of Pb$_2$KNb$_5$O$_{15}$ (lead potassium niobate) exhibits large coupling coefficients $k^2$. As mentioned above, the electromechanical coupling coefficient $k^2$ should preferably be greater than 0.1 (10%).

Referring to FIG. 1 again, the material, the cross section and the propagation axis of the piezo-electric substrate 14 have been so selected that the propagation mode will have a large coupling coefficient $k^2$ as mentioned above. The transducers 2 and 3, multi-strip couplers 15 and 16, and reflecting transducers 17, 18, 19 and 20 are constructed of electrically conductive thin electrodes on the surface of the substrate. The transducers 2 and 3 are of a so-called interdigital type in which the electrodes of the form of reeds are electrically connected in the form of comb teeth being alternately inserted between each other. The pitch Po between the electrodes satisfies the relation of the sonic speed $v_0$ of the surface acoustic waves and the synchronism frequency $f_0$, i.e., $$P_O = v_0/2f_0$$

The coupling transducers 15 and 16 are composed of electrically conductive thin films in parallel with the electrodes of the input and output transducers 2 and 3 such that the two transducers 2 and 3 are coupled together. The pitch $P_M$ between the electrodes is usually so selected as to satisfy the following requirements, $$P_M < P_O$$

Further, the number of electrodes are so selected that when the surface acoustic waves incident from the input transducer 2 or the output transducer 3 are going out of the multi-strip couplers, the electric power is equally divided into two with respect to the two reflectors.

The electrodes of the reflecting transducers 17, 18, 19 and 20 can be connected in a variety of ways. FIG. 1 shows the case in which the two terminals of the interdigital connection are open. The terminals, however, may be connected together, i.e., the electrodes may all be electrically connected. In the above two cases, frequency characteristics of the reflecting waves are not the same, though they depend upon the propagation modes of the surface acoustic waves. In the case of the interdigital connection shown in FIG. 1, the pitch $P_R$ between the reflecting electrodes is usually given by, $$P_R \approx P_O$$

Further, the number of electrode pairs $N_R$ is so set that the frequency characteristics of the reflected waves lie over a broad range which presents small insertion losses, and is usually given preferably over a range of $$3 > k_s^2 N_R \gtrsim 1$$

The number $N_R$ can be reduced with the increase in $k_s^2$. It is also allowable to improve the reflection characteristics outside the band by giving emphasis to the crossing width in the interdigital connection.

Figure 3:
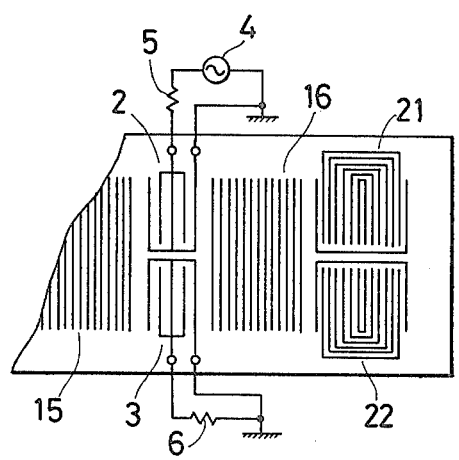

FIG. 3 shows another embodiment according to the present invention of a ring-type construction as that of FIG. 1. In this case, whole or part of the reflecting transducers are of the U-shaped multi-strip coupler-type reflectors 21 and 22 as shown in FIG. 3. The pitch $P_{RS}$ between the electrodes of the U-shaped multi-strip couplers is usually so set as to satisfy the requirement, $$P_{RS} < P_O$$

and the number of the electrodes $M_{RS}$ is so determined that most of the incident waves are reflected. The reflecting frequency characteristics of the U-shaped multi-strip coupler-type transducers are broader than those of the interdigital transducers of FIG. 1.

The reflectors used for the filter of the present invention can be modified in a variety of ways. It is possible to attain desired reflecting frequency characteristics by providing a terminal on a portion of the interdigital reflecting electrodes and connecting a load impedance thereto. It is further permitted to replace some of the four reflectors by the grating reflectors in order to change the reflecting frequency characteristics by replacing a portion of the reflectors by the grating.

Furthermore, the input and output transducers can be divided into a plurality of units to receive and produce the electric signals. It is also possible to use a well-known series connection or parallel connection in combination with the transducers.

What is claimed is:

1. A surface acoustic wave filter comprising a transmitting transducer for converting the electrical signals into surface waves, a receiving transducer for converting the surface waves into electrical signals, reflecting transducers disposed on both sides of said transmitting and receiving transducers, and coupling transducers disposed between said transmitting and receiving transducers and said reflecting transducers, which are all arrayed on a surface of a piezo-electric substrate, wherein said coupling transducers work as 3-dB directional couplers.

2. A surface acoustic wave filter as set forth in claim 1, wherein said 3-dB directional couplers are composed of a plurality of electrically conductive thin film strips arrayed in parallel, and the number of said strips Mc is determined by the following relation, $$Mc \approx \frac{\pi}{2FK^2} \cdot \frac{\frac{\theta}{2}}{\sin \theta/2}$$

where $k^2$ denotes an electromechanical coupling coefficient, F a constant determined by the shape of the strips, $\theta = 2\pi f \alpha d_O/v_s$, f a frequency of the surface waves, $d_O$ a distance between the strips, $\alpha$ an active fraction of periodically repeating distance of strips, and $v_s$ signifies a sonic speed of the surface waves.

3. A surface acoustic wave filter as set forth in claim 2, wherein said piezo-electric substrate is made of any one of a single crystal of lithium niobate, a ceramic of lead zirconate-titanate, or a single crystal of lead potassium niobate, having an electromechanical coupling coefficient $k^2$ which is greater than 0.1.

4. A surface acoustic wave filter according to claim 1, wherein said reflecting transducers are constructed of a plurality of conductive strips, the ends of which are commonly connected.

5. A surface acoustic wave filter according to claim 1, wherein said reflecting transducers are constructed of a plurality of conductive strips, each of which is a U-shape.

* * * * *